(12) United States Patent
Cho et al.

(10) Patent No.: US 8,045,105 B2
(45) Date of Patent: Oct. 25, 2011

(54) THIN FILM TRANSISTOR ARRAY PANEL AND MANUFACTURING METHOD THEREOF

(75) Inventors: Seung-Hwan Cho, Suwon-si (KR); Bo-Sung Kim, Seoul (KR); Jung-Han Shin, Yongin-si (KR); Ju-Han Bae, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 88 days.

(21) Appl. No.: 12/369,646

(22) Filed: Feb. 11, 2009

(65) Prior Publication Data

US 2010/0038647 A1   Feb. 18, 2010

(30) Foreign Application Priority Data

Aug. 12, 2008   (KR) .................. 10-2008-0078938

(51) Int. Cl.
*G02F 1/1335*   (2006.01)
(52) U.S. Cl. .......................... 349/114; 349/113
(58) Field of Classification Search .................. None
See application file for complete search history.

(56) References Cited

U.S. PATENT DOCUMENTS

| | | | |
|---|---|---|---|
| 6,947,108 B2 * | 9/2005 | Chae | 349/113 |
| 2006/0197891 A1 | 9/2006 | Chang | |
| 2007/0013839 A1 * | 1/2007 | Rho | 349/114 |
| 2007/0019137 A1 * | 1/2007 | Kim et al. | 349/114 |
| 2007/0146592 A1 * | 6/2007 | Kimura | 349/114 |
| 2008/0049176 A1 * | 2/2008 | Kim et al. | 349/114 |

FOREIGN PATENT DOCUMENTS

| | | |
|---|---|---|
| JP | 2000-267089 | 9/2000 |
| JP | 2001-083506 | 3/2001 |
| JP | 2004-216208 | 8/2004 |
| JP | 2004-219449 | 8/2004 |
| JP | 2005-055829 | 3/2005 |
| KR | 2003-0052093 | 6/2003 |
| KR | 2003-0057060 | 7/2003 |
| KR | 2005-0070608 | 7/2005 |
| KR | 2006-0034032 | 4/2006 |

* cited by examiner

*Primary Examiner* — Thanh-Nhah Nguyen
(74) *Attorney, Agent, or Firm* — Innovation Counsel LLP

(57) ABSTRACT

A thin film transistor substrate according to one or more embodiments of the present invention includes a gate line formed on a substrate, a data line that is insulated from and intersects the gate line, a thin film transistor connected to the gate line and the data line, a barrier rub formed on the thin film transistor and partitioning a plurality of first openings, a reflecting electrode formed in each of the first openings, and a pixel electrode formed on the reflecting electrode and that is electrically connected to the thin film transistor.

17 Claims, 10 Drawing Sheets

110  140  124

110  140  175  124 173  171

THIN FILM TRANSISTOR ARRAY PANEL AND MANUFACTURING METHOD THEREOF

CROSS-REFERENCE TO RELATED APPLICATIONS

This application claims priority to and the benefit of Korean Patent Application No. 10-2008-0078938, filed in the Korean Intellectual Property Office on Aug. 12, 2008, the entire contents of which are incorporated herein by reference.

BACKGROUND

1. Technical Field

The present invention relates to a thin film transistor array panel and a manufacturing method thereof.

2. Related Art

Generally, a liquid crystal display (LCD) has a structure in which two display panels are arranged such that their surfaces, which are provided with field generating electrodes, face each other, and a liquid crystal material is provided between the two display panels. In the above-described LCD, liquid crystal molecules are moved by an electric field generated by applying a voltage to the two electrodes, and a desired image is obtained by controlling the transmittance of light that varies depending on the movement of the liquid crystal molecules. However, because the liquid crystal display is a non-emissive device, a light source is necessary. Typically, the LCD may be classified as a transmissive type or a reflective type depending on the type of light source utilized.

In the liquid crystal display of the transmissive type, light emitted from a backlight, as a light source that is attached to the rear surface of the liquid crystal panel, is incident to the liquid crystal layer such that light transmittance is controlled according to an arrangement of liquid crystal molecules to display images. In the liquid crystal display of the reflective type, natural external light or artificial light is reflected, and the light transmittance is controlled according to arrangement of the liquid crystal molecules.

The transmissive type of liquid crystal display generates bright images that can be displayed in a dark environment since it uses a rear light source, but high power consumption is generated. The reflective type liquid crystal display consumes low power in comparison with the transmissive type since it depends on external natural light or external artificial light, but it is difficult to use in a dark environment.

Accordingly, a transflective type of LCD that can appropriately select a reflection mode and a transmissive mode according to the circumference has been suggested. In the transflective LCD, a reflection region and a transmission region are provided in one pixel area. A reflecting electrode is provided in the reflection region, and a pixel electrode made of a transparent material is provided in the transmission region. To increase reflection efficiency of the reflecting electrode, a lower layer is formed in an embossed shape and the reflecting electrode is formed thereon so that the reflecting electrode has protrusions and depressions. However, the embossing process is performed using a photolithography process, thereby complicating the process.

It should be appreciated that the above information disclosed in this Background section is only for enhancement of understanding of the background of the invention, and therefore, it may include information that does not form the prior art that is already known in this country to a person of ordinary skill in the art.

SUMMARY

One or more embodiments of the present invention provide a thin film transistor array panel, which may have an advantage of simplifying a process without reducing a reflectivity of a reflecting electrode, and a manufacturing method thereof.

An exemplary thin film transistor (TFT) substrate according to an embodiment of the present invention includes a gate line formed on a substrate, a data line that is insulated from and intersects the gate line, a thin film transistor connected to the gate line and the data line, a barrier rib formed on the thin film transistor and partitioning a plurality of first openings, a reflecting electrode formed in each of the first openings, and a pixel electrode formed on the reflecting electrode and electrically connected to the thin film transistor.

The reflecting electrode may have a concave shape. The reflecting electrode may be formed by an Inkjet printing method, and the barrier rib may be made of a transparent organic material. The pixel electrode may be formed by the Inkjet printing method. The barrier rib may include a plurality of second openings respectively disposed in a portion that is overlapped with the thin film transistor, the reflecting electrode may be formed in each of the second openings, and the pixel electrode may be formed on the reflecting electrode in the second opening. The thickness of the reflecting electrode may be gradually increased toward the barrier rib that partitions the first and second openings such that a concave shape may be formed. The barrier rib may include a bottom unit that forms a bottom of the second opening, and the reflecting electrode in the second opening may be formed on the bottom unit. The barrier rib is separated from the first opening and may have a third opening that overlaps with the pixel electrode.

A plane pattern of at least one of the first opening, the second opening, and the third opening may be circular or polygonal. The thin film transistor may include a gate electrode connected to the gate line, a semiconductor overlapped with the gate electrode, a source electrode overlapped with the semiconductor and connected to the data line, and a drain electrode overlapped with the semiconductor and including a drain electrode that faces the source electrode, and the pixel electrode is connected to the drain electrode through a contact hole formed in the barrier rib. The semiconductor may be an organic semiconductor.

The barrier rib is separated from the first opening and may have a third opening that overlaps with the pixel electrode. The thin film transistor may include a gate electrode connected to the gate line, a semiconductor overlapped with the gate electrode, a source electrode overlapped with the semiconductor and connected to the data line, and a drain electrode overlapped with the semiconductor and including a drain electrode that faces the source electrode, and the pixel electrode is connected to the drain electrode through a contact hole formed in the barrier rib. The semiconductor may be an organic semiconductor, and the barrier rib may be made of a transparent organic material. The first opening may include a first region that is adjacent to the barrier rib and a second region that is surrounded by the first region, the reflecting electrode may be formed in the first region, and the thickness of the reflecting electrode may be gradually increased toward the barrier rib such that an inclined plane is formed.

An exemplary manufacturing method of a thin film transistor substrate according to another embodiment of the present invention includes forming a gate line on a substrate, forming a data line that is insulated from and intersects the gate line, forming a thin film transistor connected to the gate line and the data line, forming a barrier rib having a plurality of first openings formed in a pixel area that is partitioned by the gate line and the data line, forming a reflecting electrode in a concave lens shape in each of the plurality of first openings by using an Inkjet printing method, and forming a pixel electrode disposed in the pixel area, electrically connected to the thin film transistor, and contacting the respective reflecting electrodes.

The pixel electrode may be formed by the Inkjet printing method. When forming the barrier rib, a second opening disposed in a portion that overlaps with the thin film transistor is formed therewith. When forming the barrier rib, the barrier rib has a bottom unit that becomes a bottom of the second opening by forming photosensitive film patterns respectively having difference thicknesses in a portion where the barrier rib remains, a portion where the first opening is formed, and a portion where the second opening is formed.

According to the present invention, the reflecting electrode may be easily formed in a concave lens shape by forming a plurality of openings in the reflective area and forming the reflecting electrode by using the Inkjet printing method, thereby improving transmission efficiency.

DETAILED DESCRIPTION

Figure 1:
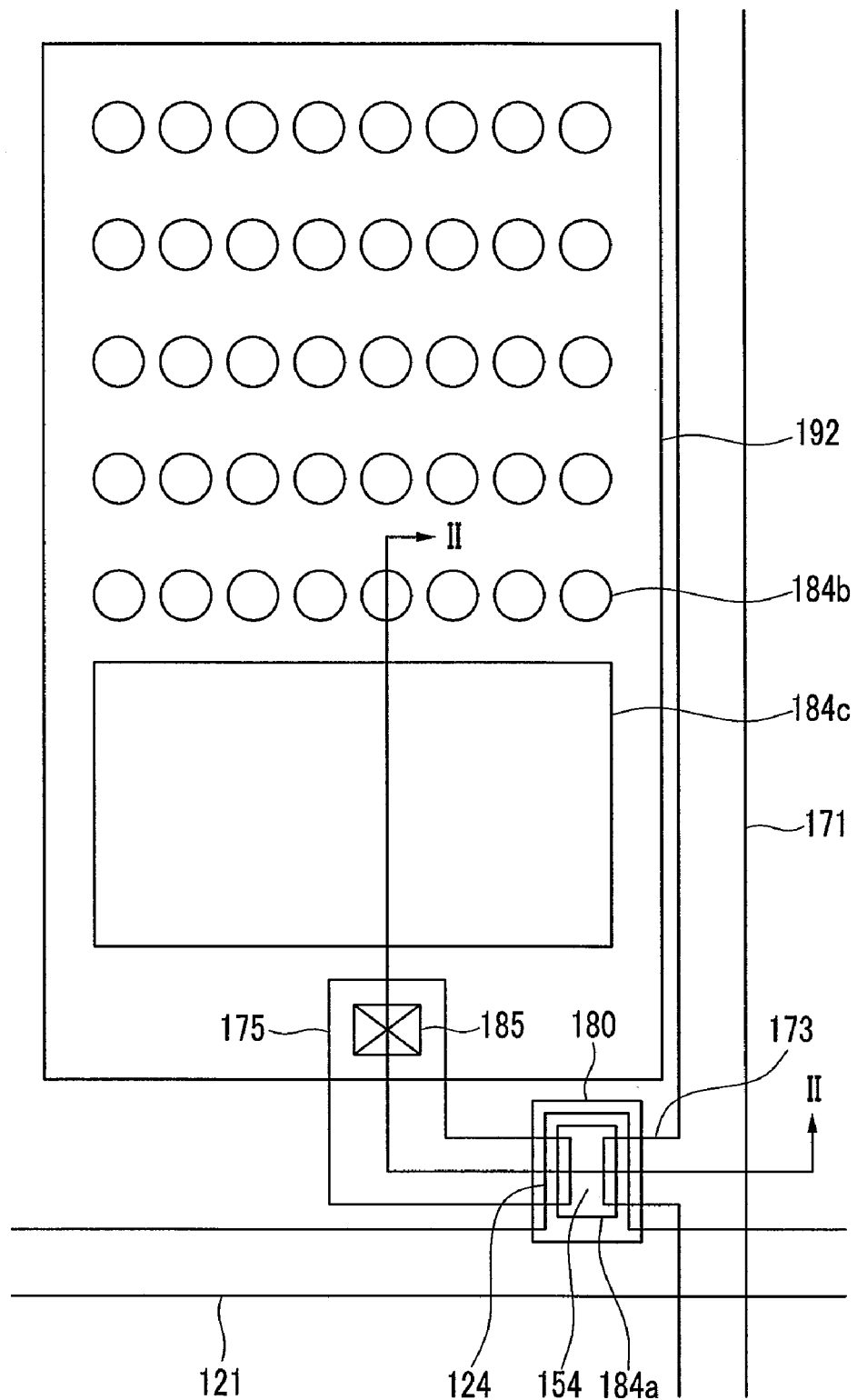
FIG. 1 is a layout view of a thin film transistor (TFT) array panel according to an exemplary embodiment of the present invention.

Embodiments of the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, there are no intervening elements present.

Figure 2:
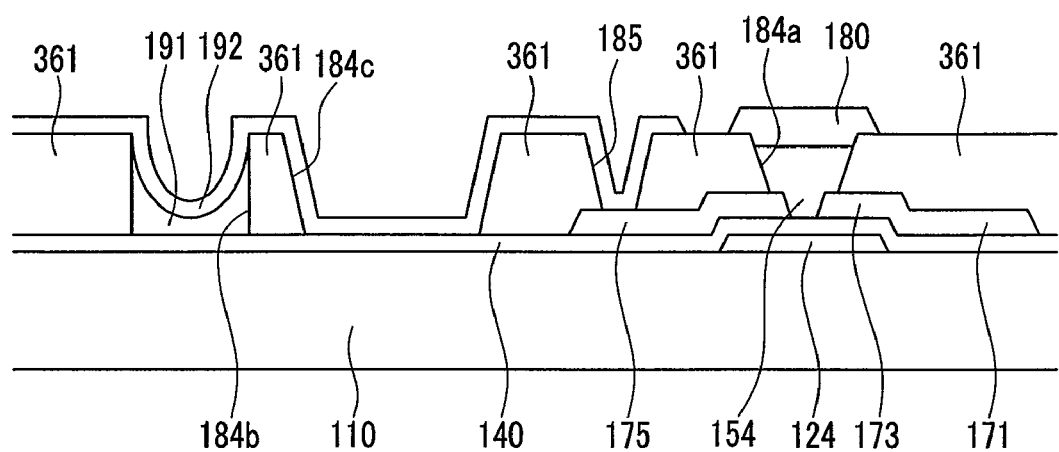
FIG. 2 is a cross-sectional view of the TFT array panel of FIG. 1, taken along the line II-II.
Figure 3:
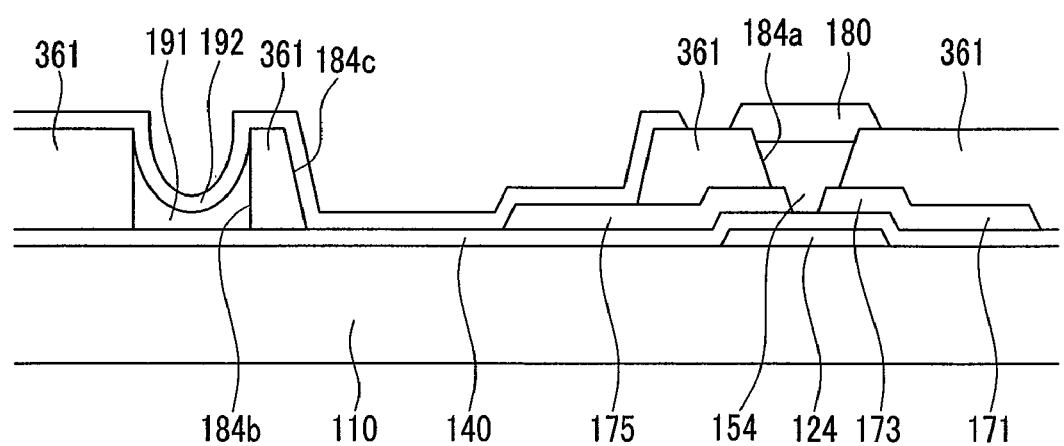
FIG. 3 is a layout view of a TFT array panel according to another exemplary embodiment of the present invention.
Figure 4:
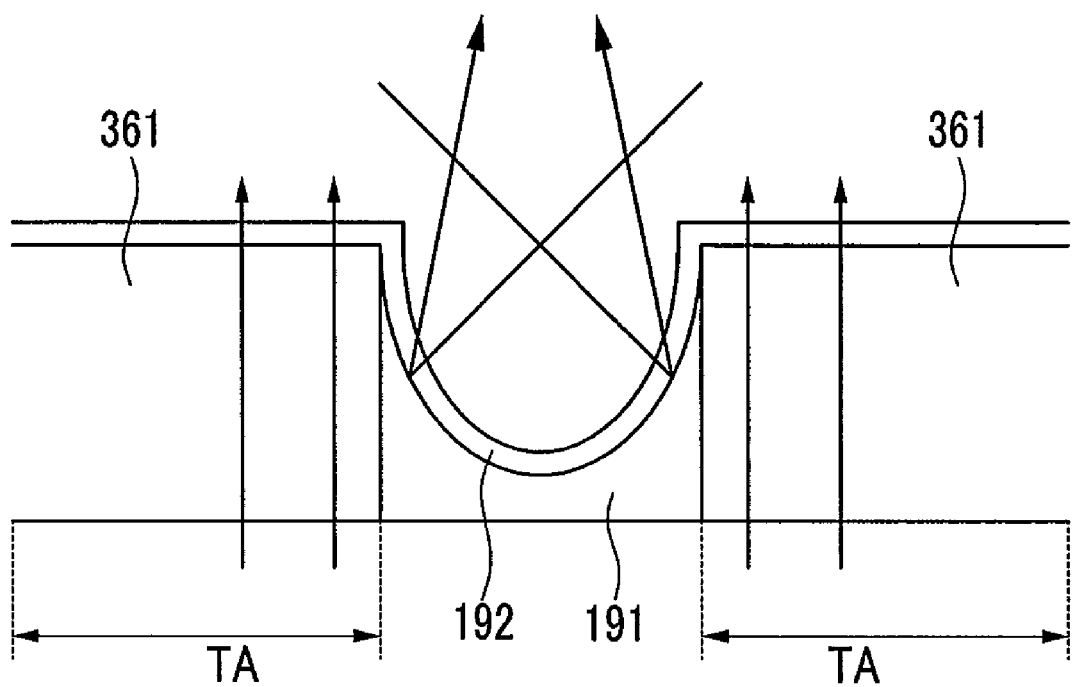
FIG. 4 is an enlarged view of a reflection electrode portion of FIG. 2.

Referring to FIGS. 1 and 2, a thin film transistor (TFT) array panel according to an exemplary embodiment of the present invention will be described in further detail. FIG. 1 is a layout view of a TFT array panel according to an exemplary embodiment of the present invention, FIG. 2 is a cross-sectional view of the TFT array panel FIG. 1 taken along the line II-II, FIG. 3 is a layout view of a TFT array panel according to another exemplary embodiment of the present invention, and FIG. 4 is an enlarged view of a reflecting electrode portion of FIG. 2.

Referring to FIGS. 1 and 2, a plurality of gate lines 121 are formed on an insulation substrate 110 that is made of transparent glass or plastic. The gate lines 121 transmit gate signals and substantially extend in a horizontal direction. Each gate line 121 includes a plurality of gate electrodes 124 protruded upward and a wide end portion (not shown) to be connected with other layers or an external driving circuit.

A gate insulating layer 140 is formed on the gate lines 121. The gate insulating layer 140 may be made of a soluble high molecular compound such as silicon oxide ($SiO_2$), silicon nitride ($SiN_x$), polyimide, polyvinyl alcohol, a polyfluorane-containing compound, or a soluble polymer such as parylene.

A plurality of data lines 171 and a plurality of drain electrodes 175 are formed on the gate insulating layer 140. The data lines 171 transmit data signals, and substantially extend in a vertical direction such that they cross the gate lines 121. Each data line 171 includes a plurality of source electrodes 173 extending to the gate electrodes 124.

The drain electrodes 175 are separated from the data lines 171 and face the source electrodes 173 with respect to the gate electrodes 124. Each drain electrode 175 has an end portion (not shown) that is widely extended for connection with other layers.

A barrier rib 361 having first to third openings 184a, 184b, and 184c and a contact hole 185 is formed on the data line 171 and the drain electrode 175. The barrier rib 361 may be made of a transparent organic material that may be subject to a solution process or a transparent organic material having photosensitivity.

The first opening 184a exposes the gate insulating layer 140 interposed between the source electrode 173 and the drain electrode 175 and overlaps the gate electrode 124. In addition, the second opening 184b exposes the gate insulating layer 140 in the lower side and is arranged in a matrix format in a pixel area partitioned by the gate line 121 and the data line 171. The third opening 184c is located to be lower than the second opening 184b and is adjacent to the lower gate line 121. The second opening 184b and the third opening 184c may be formed in various shapes such as circular or polygonal, and an area where the second openings 184b are located is more than 50% of the pixel area and is larger than an area of the third opening 184c in the pixel area. The second and third openings 184b and 184c are formed as circles according to the exemplary embodiment of the present invention, and they may be formed in polygons.

The contact hole 185 exposes an extended portion of the drain electrode 175. In one implementation, the contact hole 185 and the third opening 184c may be integrally formed as shown in FIG. 3, and in this case, the extended portion of the drain electrode 175 is placed in the third opening 184c.

An organic semiconductor 154 is formed in the first opening 184a. The organic semiconductor 154 may include a high-molecular compound or a low-molecular compound that is soluble in an aqueous solution or an organic solvent, and may be formed by a solution process such as an Inkjet printing method. The organic semiconductor 154 may be formed by a vacuum evaporation process using a shadow mask, and in this case, a barrier rib may be omitted. The organic semiconductor 154 may be a derivative containing a tetracene or pentacene substituent, or 4 to 8 oligothiophenes coupled to one another through 2 and 5 positions of thiophene rings. In addition, the organic semiconductor 154 may be made of thienylene, polyvinylene, or thiophene.

One gate electrode 124, one source electrode 173, and one drain electrode 175 form a thin film transistor together with the organic semiconductor 154, and a channel Q of the thin film transistor is formed in the organic semiconductor 154 interposed between the source electrode 173 and the drain electrode 175. In this case, facing portions of the source electrode 173 and the drain electrode 175 are formed in a bent shape so that the electrical current characteristics may be enhanced by an increase of the channel width.

A passivation member 180 is formed on the organic semiconductor 154. The passivation member 180 may be made of a fluorine copolymer or parylene that may be formed at room temperature or a low temperature and may prevent the organic semiconductor 154 from being damaged in the manufacturing process.

A pixel electrode 192 that is connected to the drain electrode 175 through the contact hole 185 is formed on the barrier rib 361. The pixel electrode 192 may be formed of ink that includes poly(3,4-ethylenedioxythiophene) (PEDOT) or ITO (indium tin oxide) powder by using the Inkjet printing method. The pixel electrode 192 is formed on the entire pixel area including the second opening 184b and the third opening 184c and receives a data signal from the drain electrode 175 through the contact hole 185.

In addition, a reflecting electrode 191 is formed under the pixel electrode 192. The reflecting electrode 191 may be formed of ink that includes reflective metal particles in a nanometer size such as silver (Ag), gold (Au), copper (Cu), nickel (Ni), palladium (Pd), aluminum (Al), or molybdenum (Mo) by using the Inkjet printing method. In one aspect, each reflecting electrode 191 is located within the second opening 184b and has a concave lens shape of which the thickness is gradually decreased toward the center of the second opening 184b from an edge thereof.

In one implementation, when the reflecting electrode 191 has the concave lens shape, incident light from the external environment is irregularly reflected at a slope of an edge of the reflecting electrode 191, as shown in FIG. 4. In another implementation, when the reflecting electrode 191 is formed only in the second opening 184 as in the exemplary embodiment of the present invention, only a pixel electrode 192 is formed on a surface of the barrier rib 361 that partitions the second opening 184b, as shown in FIG. 4.

In one aspect, the barrier rib 361 that partitions the second opening 184b may be used as a transflective area TA. In another aspect, although an area of the second opening 184b where the reflecting electrode 191 is formed is greater than an area of the third opening 184c, the barrier rib that partitions the second opening 184b becomes the transflective area TA, and accordingly, the area of the reflection area is substantially the same as that of the transflective area. The pixel electrode 192 forms an electric field together with a separate common electrode (not shown).

A method for manufacturing the thin film transistor of FIGS. 1 and 2 will now be described with reference to FIG. 5 to FIG. 9 and also FIG. 2. FIGS. 5 to 9 are cross-sectional views that sequentially show a method for manufacturing the thin film transistor according to an exemplary embodiment of the present invention.

Figure 5:
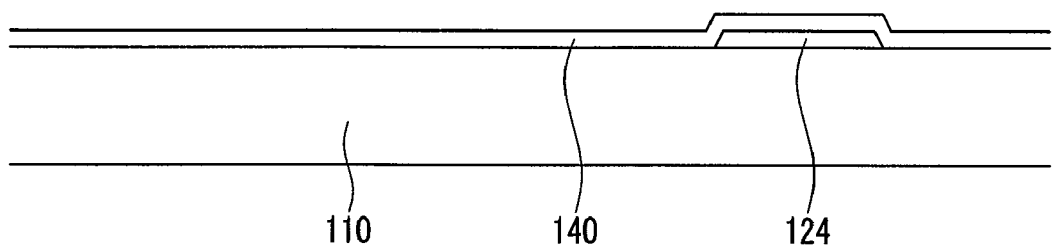
FIG. 5 to FIG. 9 are cross-sectional views that sequentially show a method for manufacturing a TFT substrate according to an exemplary embodiment of the present invention.

As shown in FIG. 5, the gate line including the gate electrode 124 is formed on the substrate 110. The gate line may be formed by the Inkjet printing method using metal-containing solution or by patterning after deposition using sputtering. Then, the gate insulating layer 140 is formed on the gate line.

The gate insulating layer 140 may be made of an inorganic compound or a soluble high polymer compound. When the gate insulating layer 140 is made of the inorganic compound, an etching process using a photosensitive film may be used, and when the gate insulating layer is made of the soluble high polymer, an Inkjet printing method may be used.

Figure 6:
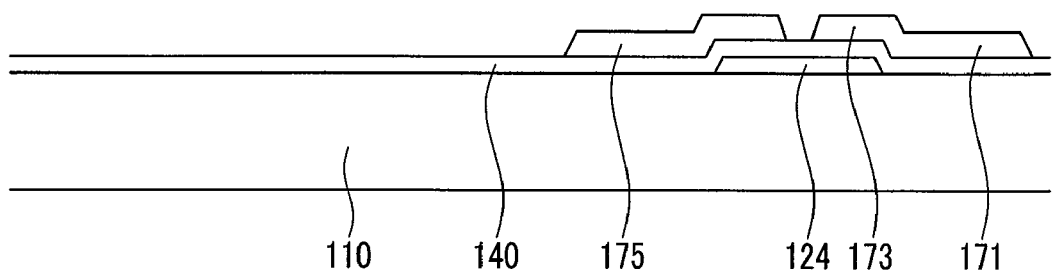

As shown in FIG. 6, the data line 171 including the source electrode 173 and the drain electrode 175 are formed on the gate insulating layer 140. The data line 171 and the drain electrode 175 may be formed by the same method as the gate line 121.

Figure 7:
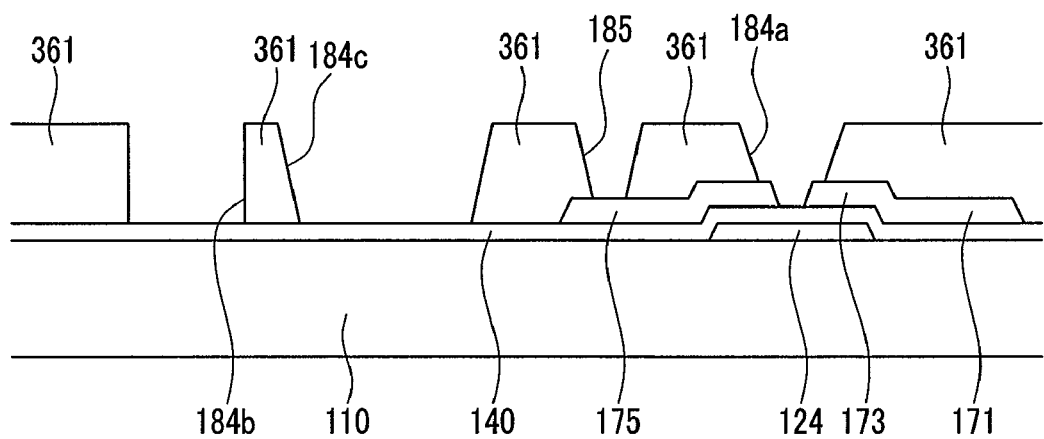

As shown in FIG. 7, the barrier rib 361 having the first to third openings 184a, 184b, and 184c and the contact hole 185 is formed on the data line 171 and the drain electrode 175.

When the barrier rib 361 is made of an organic material that may perform a solution process, the Inkjet printing method may be used, and when the barrier rib 361 is made of a photosensitive organic material, an exposure and development process may be used.

Figure 8:
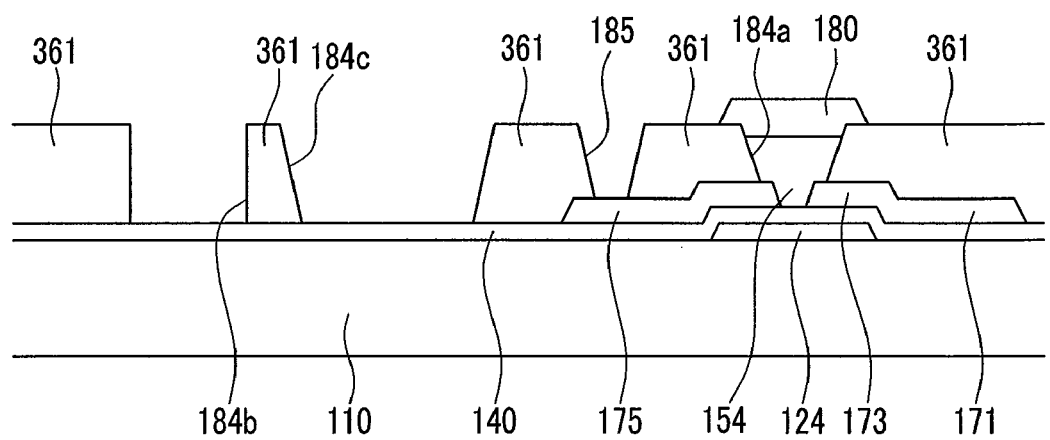

As shown in FIG. 8, the organic semiconductor 154 is formed in first opening 184a by using the Inkjet printing method. Then, the passivation member 180 that covers the organic semiconductor 154 is formed by using the Inkjet printing method or a photolithography process.

Figure 9:
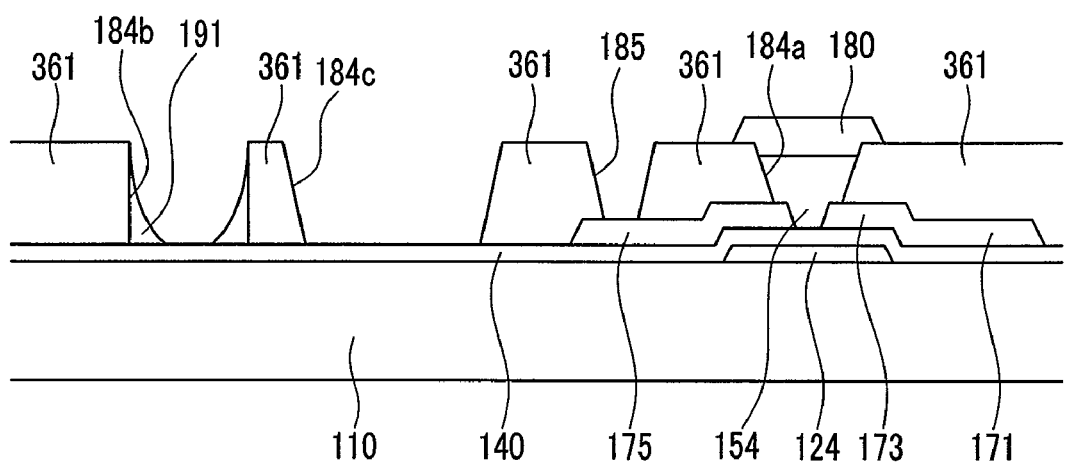

As shown in FIG. 9, the reflecting electrode 191 is formed in the second opening 814 by using the Inkjet printing method. Ink dripped in the second opening 184b becomes gradually thinner toward the center of the second opening 184b from the edge of the second opening 184b that is close to the barrier rib 361 as time passes due to the shape of second opening 184b such that a concave lens shape is formed. An inclination angle of the inclined plane of the edge of the reflecting electrode 191 may be adjusted by controlling the amount of ink that forms the reflecting electrode 191.

As shown in FIG. 2, the transparent electrode 192 is formed on the reflecting electrode 191 by using the Inkjet printing method. In this implementation, materials that do not react with each other (i.e., orthogonal to each other) are selected to respectively form the reflecting electrode 191 and the transparent electrode 192.

Figure 10:
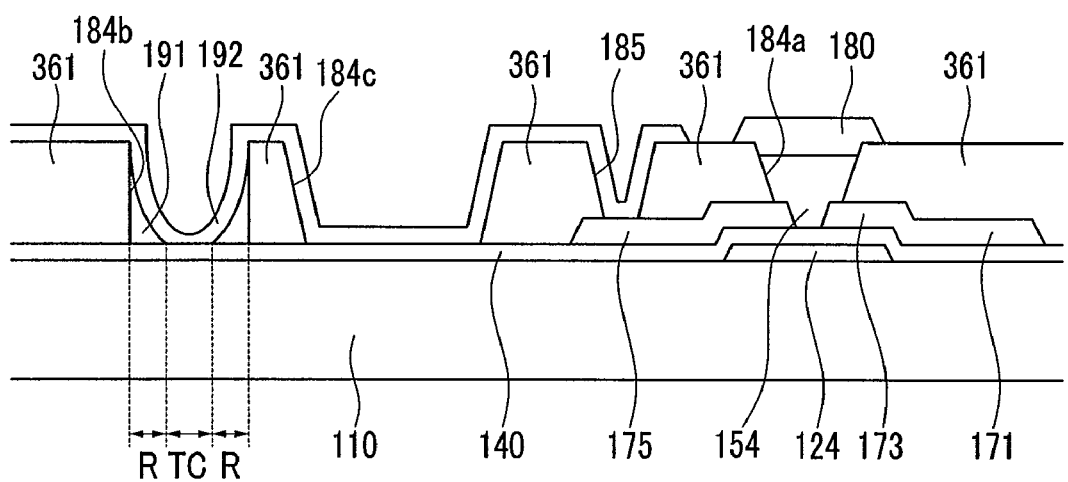
FIG. 10 is a cross-sectional view of a TFT according to another exemplary embodiment of the present invention, taken along the line II-II of FIG. 1.

FIG. 10 is a cross-sectional view of a TFT according to another exemplary embodiment of the present invention, taken along the line II-II of FIG. 1. Most of the interlayer structures of the TFT substrate of FIG. 10 are the same as those of the TFT substrate of FIG. 2, and therefore only differences between the two TFT substrates will be described. Referring to FIG. 10, a reflecting electrode 191 is formed only in a portion that is adjacent to a barrier rib 361 that partitions a second opening 184b, and is not formed in the center of the second opening 184b.

When it is used as a reflection type, light used for displaying is not reflected frontward from the reflecting electrode 191 but is irregularly scattered. When a large amount of light is reflected frontward, an object is reflected to a screen of the LCD so that display quality is deteriorated. Therefore, the reflecting electrode 191 is not formed in a flat part TC at the center of the opening 184b that has a high possibility of reflecting light frontward in order to reduce frontward reflection and to simultaneously transmit light through the flat part TC, to thereby use the flat part TC as a transmission region. Reflection of light occurs at an inclined plane R formed by the reflecting electrode 191 that is formed only at the edge of the opening 184b so that light is hardly reflected frontward.

The above-described structure may be formed by controlling a solvent included in the ink. A coffee-stain effect is increased as a boiling point of the solvent among characteristics of the solvent is increased such that ink does not remain on the flat part but the ink remains on the flat part when the boiling point of the solvent is low, and therefore a desired thickness may be obtained by controlling the boiling point of the solvent.

Figure 11:
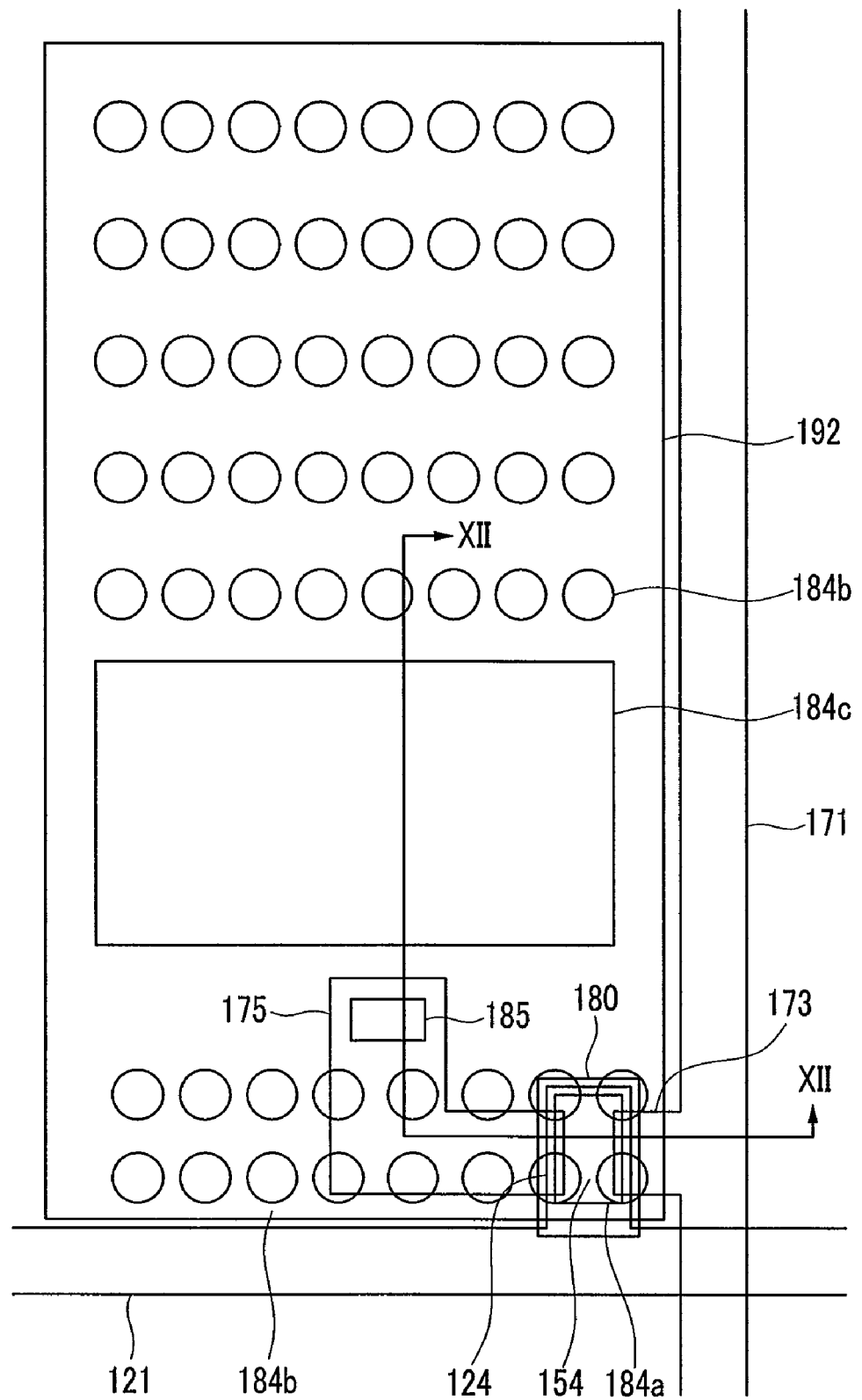
FIG. 11 is a layout view of a TFT according to another exemplary embodiment of the present invention.
Figure 12:
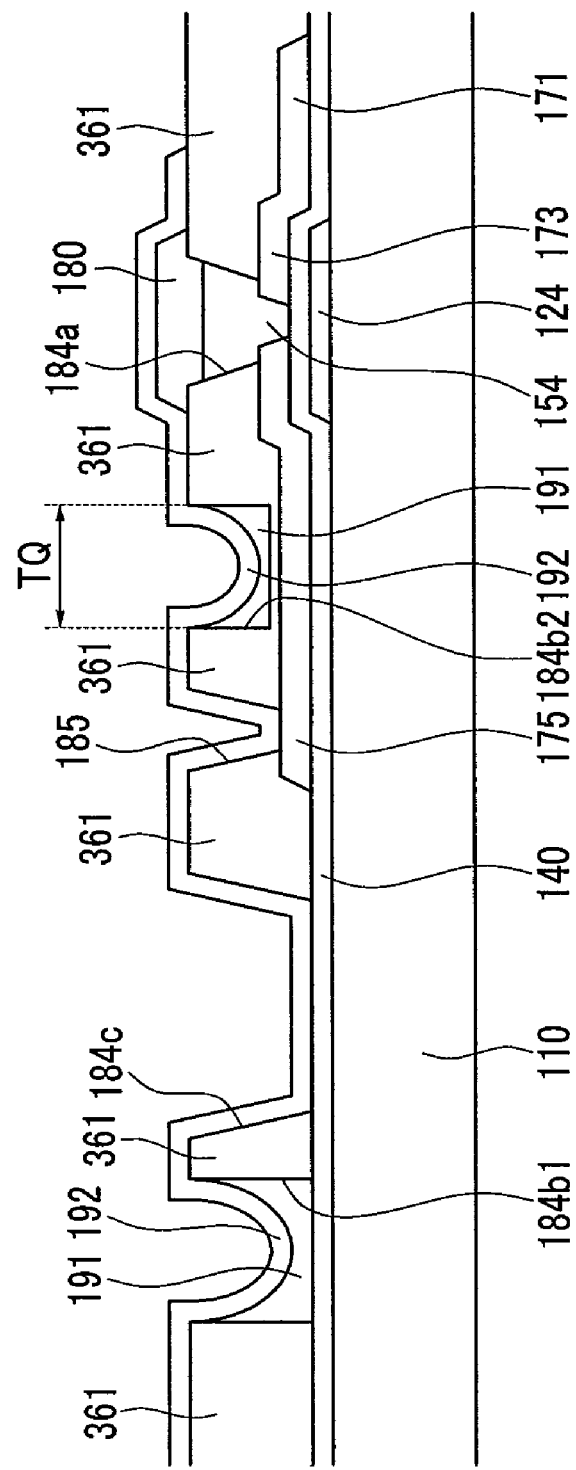
FIG. 12 is a cross-sectional view of FIG. 11, taken along the line XII-XII.

FIG. 11 is a layout view of a thin film transistor according to another exemplary embodiment of the present invention, and FIG. 12 is a cross-sectional view of FIG. 11, taken along the line XII-XII. One or more of the interlayer structures of the TFT substrates of FIGS. 11 and 12 may be considered the same as those of the TFT substrate of FIGS. 1 and 2, and therefore only differences therebetween will be described.

Referring to FIGS. 11 and 12, a second opening 184b in which a reflecting electrode 191 is formed is formed in an upper portion of the thin film transistor.

In one aspect, unlike a second opening 184b1, a barrier rib formed in a second opening 184b2 in a portion TQ overlapped with the thin film transistor is not completely eliminated, and the remaining portion of the barrier rib insulates the reflecting electrode 191, the source electrode 173, and the drain electrode 175 so as to prevent disconnection between the reflecting electrode 191 and the source electrode 173 and drain electrode 175 in the lower side. However, the second opening 184b1 in the pixel area may remain in the barrier rib (not shown) like the second opening 184b2 overlapped with the thin film transistor.

As described herein, the barrier rib under the second opening 184b2 in the portion TQ that is overlapped with the thin film transistor may be maintained by using photosensitive film patterns having different thicknesses. That is, in one aspect, when forming a barrier rib that includes the second openings 184b1 and 184b2, photosensitive film patterns that respectively correspond to a first portion where the second opening 184b1 in the pixel area is formed, a second portion where a barrier rib that partitions the second openings 184b1 and 184b2 is formed, and a third portion of the barrier rib remaining in the second opening 184b2 formed in the portion TQ that is overlapped with the thin film transistor are formed. In this case, the thicknesses of the photosensitive film patterns that correspond to the first to third portions are set to be different from each other.

As described herein, the barrier rib 361 partitioning the second opening 184b2 formed in the portion TQ that is overlapped with the thin film transistor may be formed to have a bottom unit 362 remaining in the second opening 184b2 by using the photosensitive film patterns having different thicknesses. In one aspect, a portion where the thin film transistor is located cannot be used as a transmission region due to the source electrode 173, the drain electrode 175, and the semiconductor 154, and a light blocking member is formed therein for blocking light. In the exemplary embodiment of the present invention, a reflecting electrode 191 is formed on the thin film transistor so that light may be blocked and reflection efficiency may be simultaneously increased due to increase of an area of the reflecting electrode 191.

Figure 13:
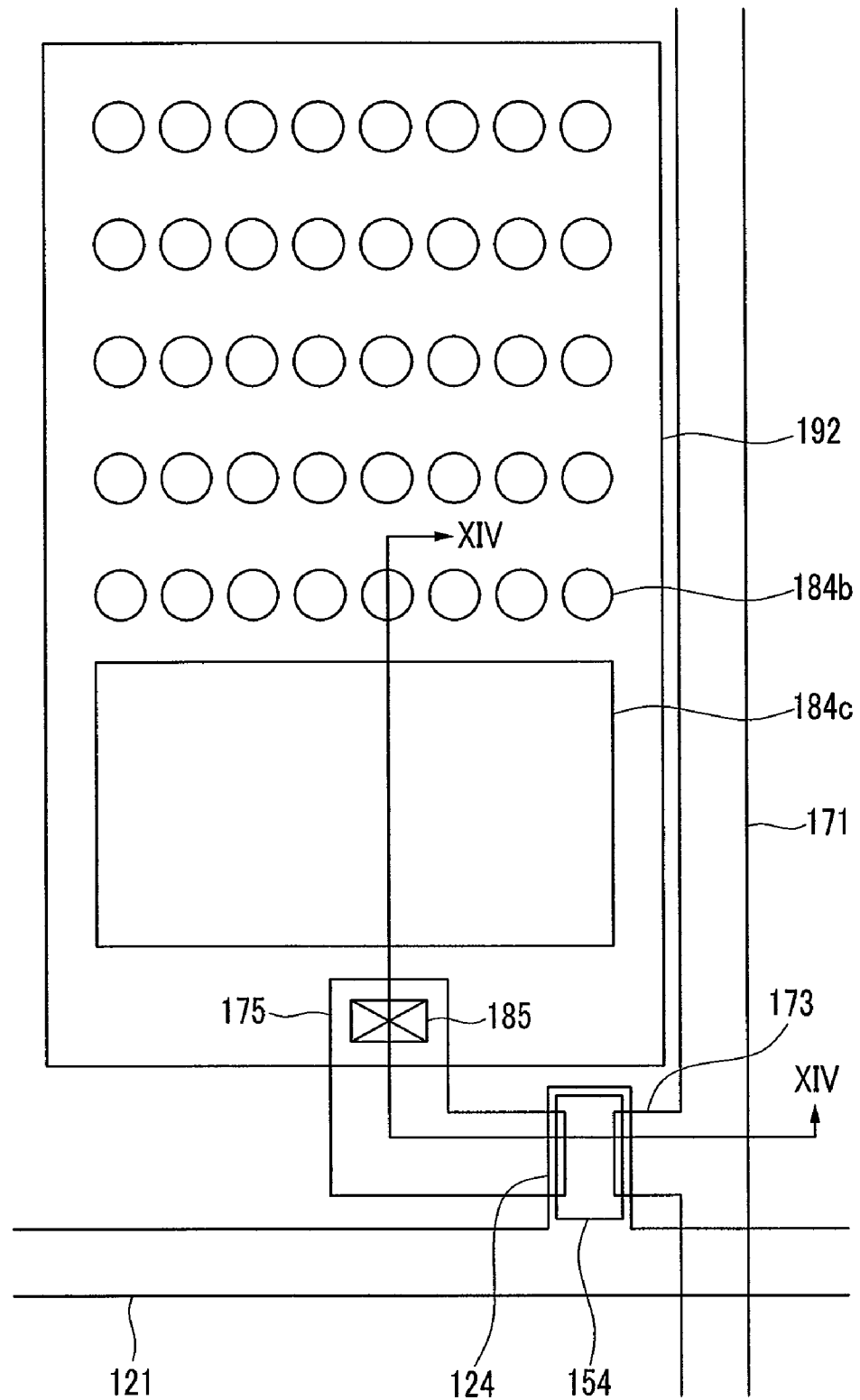
FIG. 13 is a layout view of a TFT substrate according to another exemplary embodiment of the present invention.
Figure 14:
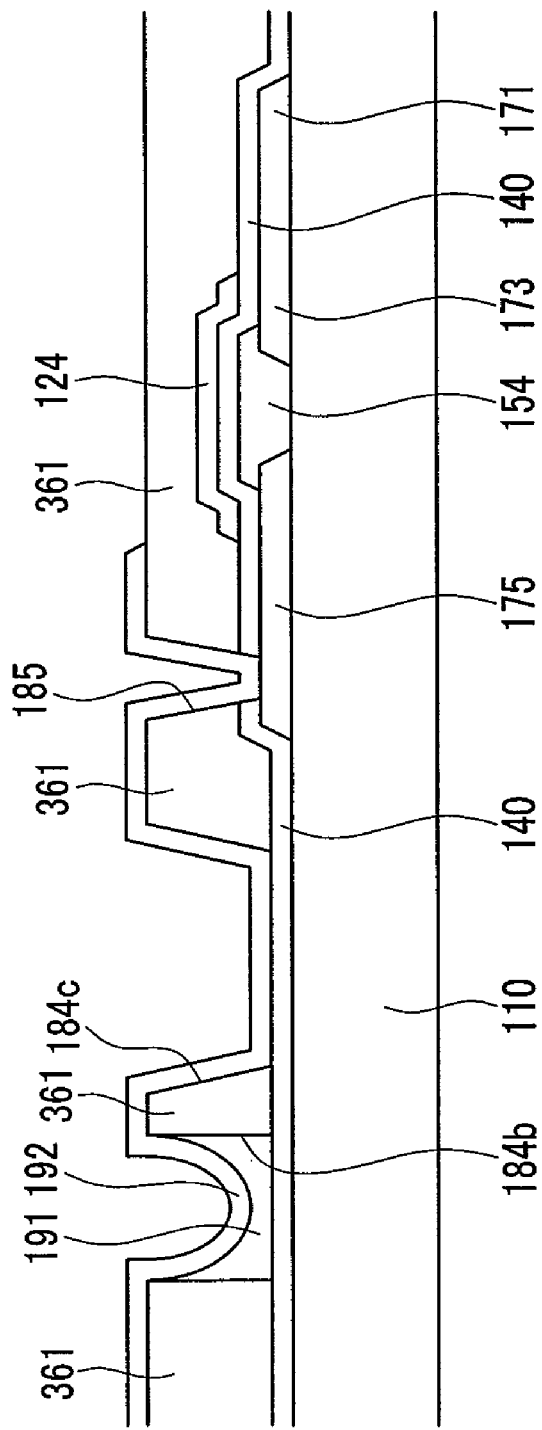
FIG. 14 is a cross-sectional view of FIG. 13, taken along the line XIV-XIV.

FIG. 13 is a layout view of a thin film transistor according to another exemplary embodiment of the present invention, and FIG. 14 is a cross-sectional view of FIG. 13, taken along the line XIV-XIV. One or more of the interlayer structures of the TFT substrates of FIGS. 13 and 14 are the same as those of the thin film transistor substrate of FIGS. 1 and 2, and therefore only differences therebetween will be described.

Referring to FIGS. 13 and 14, an organic semiconductor 154 is located under a gate electrode 124. In one aspect, a data line 171 including a source electrode 173 and a drain electrode 175 are formed on a substrate 110, and an organic semiconductor 154 is interposed between the source electrode 173 and the drain electrode 175 and contacts the source electrode 173 and the drain electrode 175. A gate insulating layer 140 is formed on the organic semiconductor 154, and a gate line 121 including a gate electrode 124 is formed on the gate insulating layer 140.

In addition, a second opening 184b, a third opening 184c, and a contact hole 185 are formed on the gate line 121. Since the organic semiconductor 154 has already been formed under the gate line 121, the first opening 184a of FIG. 1 is not formed. In the present exemplary embodiment, the contact hole 185 is formed penetrating a barrier rib 361 and the gate insulating layer 140 in order to expose the drain electrode 175.

In various implementations, a process for etching the gate insulating layer 140 for forming the contact hole 185 may be performed separately from a process for etching the barrier rib 361. A reflecting electrode 191 is formed in the second opening 184b, and a pixel electrode 192 is formed in a pixel area that includes the reflecting electrode 191, the third opening 184c, and the contact hole 185.

The above-described exemplary embodiments are applied to the thin film transistor substrate that includes the organic semiconductor, but they may be applied to a thin film transistor including a semiconductor that is made of poly-silicon or amorphous silicon.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor (TFT) substrate comprising:
a gate line formed on a substrate;
a data line that is insulated from and intersects the gate line;
a thin film transistor connected to the gate line and the data line;
a barrier rib formed on the thin film transistor and partitioning a plurality of first openings;
a reflecting electrode formed in each of the first openings; and
a pixel electrode formed on the reflecting electrode and electrically connected with the thin film transistor,
wherein each of the reflecting electrodes has a thickness decreasing from an outer edge to a center of the corresponding first opening, so as to form a concave shape.

2. The TFT substrate of claim 1, wherein the reflecting electrode is formed by an Inkjet printing method.

3. The TFT substrate of claim 2, wherein the barrier rib is made of a transparent organic material.

4. The TFT substrate of claim 3, wherein the pixel electrode is formed by the Inkjet printing method.

5. The TFT substrate of claim 1, wherein the barrier rib comprises a plurality of second openings respectively disposed in a portion that is overlapped with the thin film transistor, the reflecting electrode is formed in each of the second openings, and the pixel electrode is formed on the reflecting electrode in the second opening.

6. The TFT substrate of claim 5, wherein the thickness of the reflecting electrode is gradually increased as a distance decreases to the barrier rib that partitions the second openings such that a concave shape is formed.

7. The TFT substrate of claim 6, wherein the barrier rib comprises a bottom unit that forms a bottom of the second opening, and the reflecting electrode in the second opening is formed on the bottom unit.

8. The TFT substrate of claim 7, wherein the barrier rib is separated from the first opening and comprises a third opening that overlaps with the pixel electrode.

9. The TFT substrate of claim 8, wherein a plane pattern of at least one of the first, second, and third openings is circular or polygonal.

10. The TFT substrate of claim 9, wherein the thin film transistor comprises:
    a gate electrode connected to the gate line;
    a semiconductor overlapped with the gate electrode;
    a source electrode overlapped with the semiconductor and connected to the data line;
    a drain electrode overlapped with the semiconductor and including a drain electrode that faces the source electrode, and
    wherein the pixel electrode is connected to the drain electrode through a contact hole formed in the barrier rib.

11. The TFT substrate of claim 10, wherein the contact hole is connected to the third opening.

12. The TFT substrate of claim 10, wherein the semiconductor is an organic semiconductor.

13. The TFT substrate of claim 1, wherein the barrier rib is separated from the first opening and includes a third opening that overlaps with the pixel electrode.

14. The TFT substrate of claim 1, wherein the thin film transistor comprises:
    a gate electrode connected to the gate line;
    a semiconductor overlapping with the gate electrode;
    a source electrode overlapping with the semiconductor and connected to the data line;
    a drain electrode overlapping with the semiconductor and that includes a drain electrode that faces the source electrode, and
    wherein the pixel electrode is connected to the drain electrode through a contact hole formed in the barrier rib.

15. The TFT substrate of claim 14, wherein the semiconductor is an organic semiconductor.

16. The TFT substrate of claim 1, wherein the barrier rib is made of a transparent organic material.

17. The TFT substrate of claim 1, wherein the first opening comprises a first region that is adjacent to the barrier rib and a second region that is surrounded by the first region, and the reflecting electrode is formed in the first region and the thickness of the reflecting electrode is gradually increased as a distance decreases to the barrier rib such that an inclined plane is formed.

* * * * *